United States Patent
Angerer et al.

(10) Patent No.: US 7,349,933 B2
(45) Date of Patent: Mar. 25, 2008

(54) ANALOG DATA COMPRESSION

(75) Inventors: Walter Angerer, Maple Grove, MN (US); Rebecca Evans, Maple Grove, MN (US); Eckhard Kaul, Maple Grove, MN (US); Peter Ristanovic, Maple Grove, MN (US)

(73) Assignee: Siemens Power Transmission & Distribution, Inc., Wendell, NC (US)

( * ) Notice: Subject to any disclaimer, the term of this patent is extended or adjusted under 35 U.S.C. 154(b) by 813 days.

(21) Appl. No.: 10/863,120

(22) Filed: Jun. 8, 2004

(65) Prior Publication Data

US 2005/0008072 A1 Jan. 13, 2005

Related U.S. Application Data

(60) Provisional application No. 60/477,210, filed on Jun. 10, 2003.

(51) Int. Cl.
*G06F 7/00* (2006.01)

(52) U.S. Cl. .................................................. 708/203
(58) Field of Classification Search ................. 708/203
See application file for complete search history.

(56) References Cited

U.S. PATENT DOCUMENTS

| 4,669,097 A | * | 5/1987 | Bristol ........................ 375/240 |
| 5,321,645 A | * | 6/1994 | Konstantinides et al. ... 708/846 |
| 5,774,385 A | * | 6/1998 | Bristol ........................ 708/203 |

* cited by examiner

*Primary Examiner*—Chuong D. Ngo

(57) ABSTRACT

Analog data is compressed by processing certain data from data storage and interpolating data between data points which fall within an acceptable error range. Data points are compressed by modifying or eliminating data depending upon the slope relationship of a stored data point to artificial data points, which are representative of the range of accepted deviations from the original data point.

21 Claims, 6 Drawing Sheets

ANALOG DATA COMPRESSION

CROSS-REFERENCE TO RELATED APPLICATIONS

This application claims priority to, and incorporates by reference in its entirety, pending provisional application Ser. No. 60/477,210, filed 10 Jun. 2003.

FIELD OF THE INVENTION

The present invention relates to a method and system for compressing analog data. Analog field data is processed and compressed by eliminating certain data from data storage and interpolating data between data points which fall within an acceptable error range. Artificial data points and a stored data point are used to create regions within which data points may be interpolated.

BACKGROUND OF THE INVENTION

Data compression has become a necessity in the ever growing need for data transfer, on the Internet, voice communications, and video transmission. In essence, data compression attempts to compress information in the smallest amount of data for minimizing disk space storage and for reducing bandwidth requirements during data transmission. Telephone, and video-conferencing services are perhaps the best known services which compress data in an attempt to maximize channel or leased line usage. Moreover, communications equipment such as modems, multiplexers, routers and bridges utilize compression techniques to improve data throughput over various communications medium.

Many compression techniques compress data by minimizing the number of bits necessary to represent the data. For example, ASCII encoded data uses a 7-bit or 8-bit code set, however during transmission of this data, a reduced 3-bit code set can often be used to transmit some of the most common characters. Moreover, data transmission is often filled with blank or meaningless data which can be replaced by data representative of the amount of blank data which needs to be transmitted. For example, in audio data, silence may be represented by data representative of the length of the silence—in video transmission, white space may be represented by data representative of the amount of white space.

These compression techniques employ both lossless and lossy compression schemes which either attempt to faithfully reproduce the original data or attempt to reproduce most of the data or substantially similar data with an accepted and known amount of data loss. In a lossy compression scheme, the original data can never be recovered exactly, while in a lossless scheme, the original and exact data is reproduced. Both schemes have advantages and disadvantages and are employed according to the needs of the recipient.

Although lossy compression schemes have been applied to the transmission of analog data, there remains a need for a method and system which compresses analog data in a more efficient manner for both storage and transmission. The present invention address this need by enhancing analog data compression by utilizing the slopes of previous and next data values from the point of reference of a last stored data value.

SUMMARY OF THE INVENTION

The present invention is intended to provide a method and system by which analog data is compressed depending on the slopes of data points representative of an analog signal. Data points are compressed by modifying or eliminating data depending upon the slope relationship of a stored data point to artificial data points representative of the range of accepted deviations from the original data point.

BRIEF DESCRIPTION OF THE DRAWINGS

A wide variety of potential embodiments will be more readily understood through the following detailed description, with reference to the accompanying drawings in which.

DETAILED DESCRIPTION OF THE INVENTION

Figure 1:
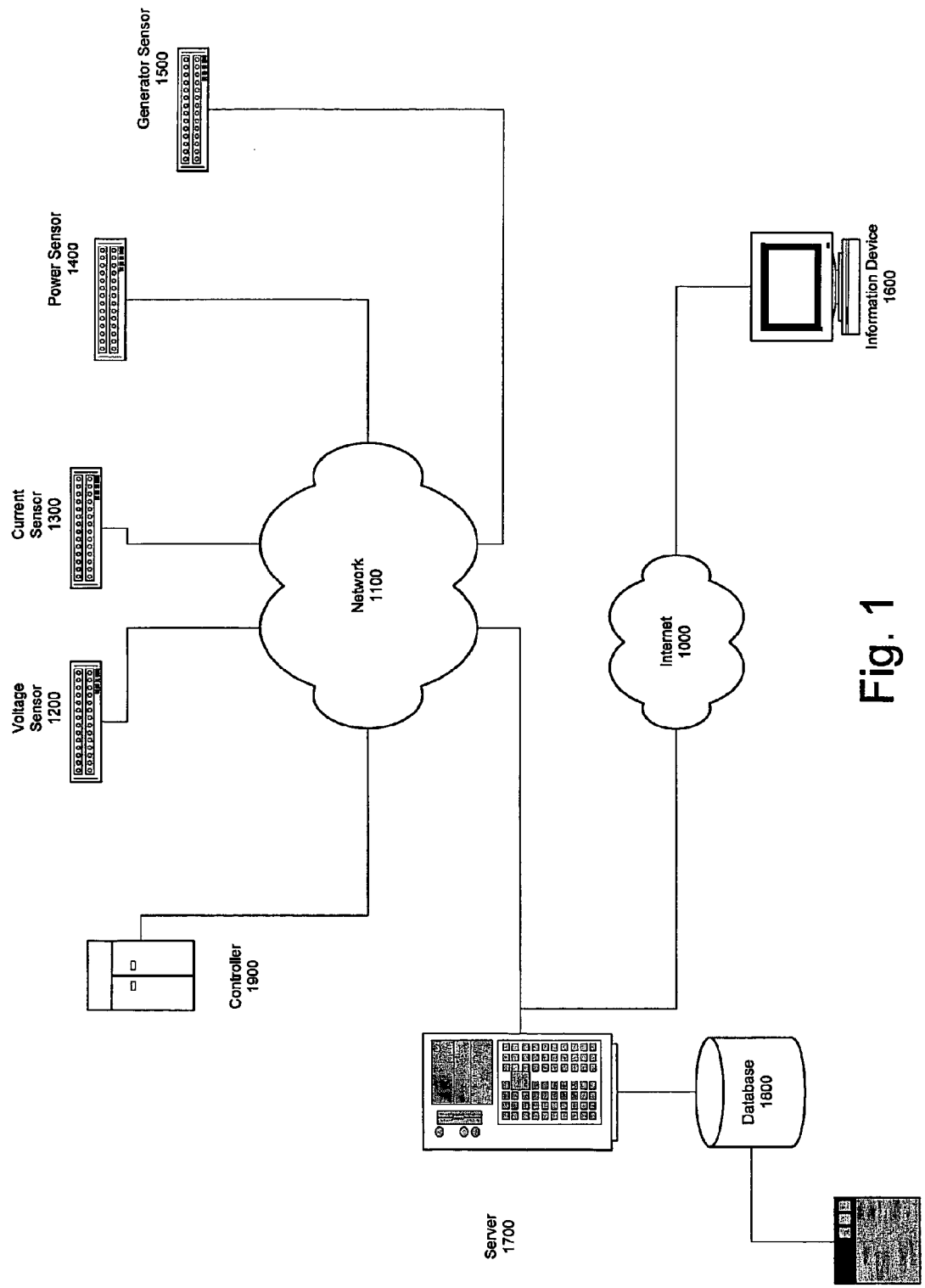
FIG. 1 is an illustration of a process, monitor and control system.

FIG. 1 is a diagram of an exemplary embodiment of a process, monitor and control system in which a network 1100 serves as the medium by which field devices such as electrical sensors and network controllers communicate. Command data to these field devices and feedback from the electrical sensors and controllers are transmitted through network 1100 to a network server 1700. Although network 1100 is shown as a SCADA network for illustration purposes, network 1100 may comprise a public, private, circuit-switched, packet-switched, virtual, radio, telephone, cellular, cable, DSL, satellite, microwave, AC power, twisted pair, Ethernet, token ring, a LAN, a WAN, the Internet, an intranet, wireless, Wi-Fi, BlueTooth, Airport, 802.11a, 802.11b, 802.11g, etc., and/or any equivalents thereof. Network 1100 may be used in all monitoring and control related industries including but not limited to energy management, material conveyance, material pumping, material manufacturing, electrical power generation, heating systems, ventilation systems, air conditioning systems, chemical processing, mining, machining, packaging and/or materials distribution.

Network 1100 provides communication among electrical controller 1900, electrical voltage sensor 1200, electrical current sensor 1300, electrical power sensor 1400, electrical generator station status sensor 1500, server 1700 and client information device 1600. Network 1100 preferably operates in a bidirectional mode for transmitting command data, receiving feedback and/or monitoring data, and for allowing operator access to field performance and status data. Field sensors such as drives, actuators, circuit breakers and controllers such as voltage regulators and programmable logic controllers are monitored and/or controlled by server 1700.

Server 1700 is a processor as referenced above and may take the form of a processor, general purpose computer, microprocessor or any hardware and/or software based computational device capable of receiving, detecting, processing and transmitting data across network 1100. The upstream monitoring data sent by field devices and/or the controller 1900 and the downstream commands are received and/or transmitted by an I/O interface and then processed by server 1700. The I/O interface is monitored and controlled by an I/O module and preferably processes sequential input data, although non-sequential and yet correlatible data can also be used. Among its various functions, server 1700 controls and manages the efficiency of network 1100 and the data stored in memory 1800. In particular, server 1700, under the control of an application program 1850, partitions and allocates an initial data space within memory 1800 for field acquired raw input data, compresses the data and stores a compressed version (compressed input data) of the input data in a partitioned and allocated second smaller data space. Memory 1800 is in physical form, a data storage device for storing application programs, raw and compressed data in various file and database structures and comprises a hard drive, ROM, RAM, PROM, EPROM, EEPROM or any other memory storage device and/or combination thereof or virtual memory capable of being accessed by server 1700.

Analog data from field sensing devices such as electrical voltage sensor 1200 or electrical current sensor 1300 provide analog feedback back to server 1700. The analog feedback is a time varying representation of the voltage or current, for example, sensed by field sensors 1200-1500. Although all captured data may be allocated memory space and stored in memory 1800, the use of memory space in this manner is highly inefficient. When exact values of analog data are critical, all captured data is stored. However, under circumstances, when close approximations are sufficient, analog data may be compressed in a manner which fairly represents the time varying nature of the field data, while controlling and maintaining a margin of error within error boundaries.

Figure 2:
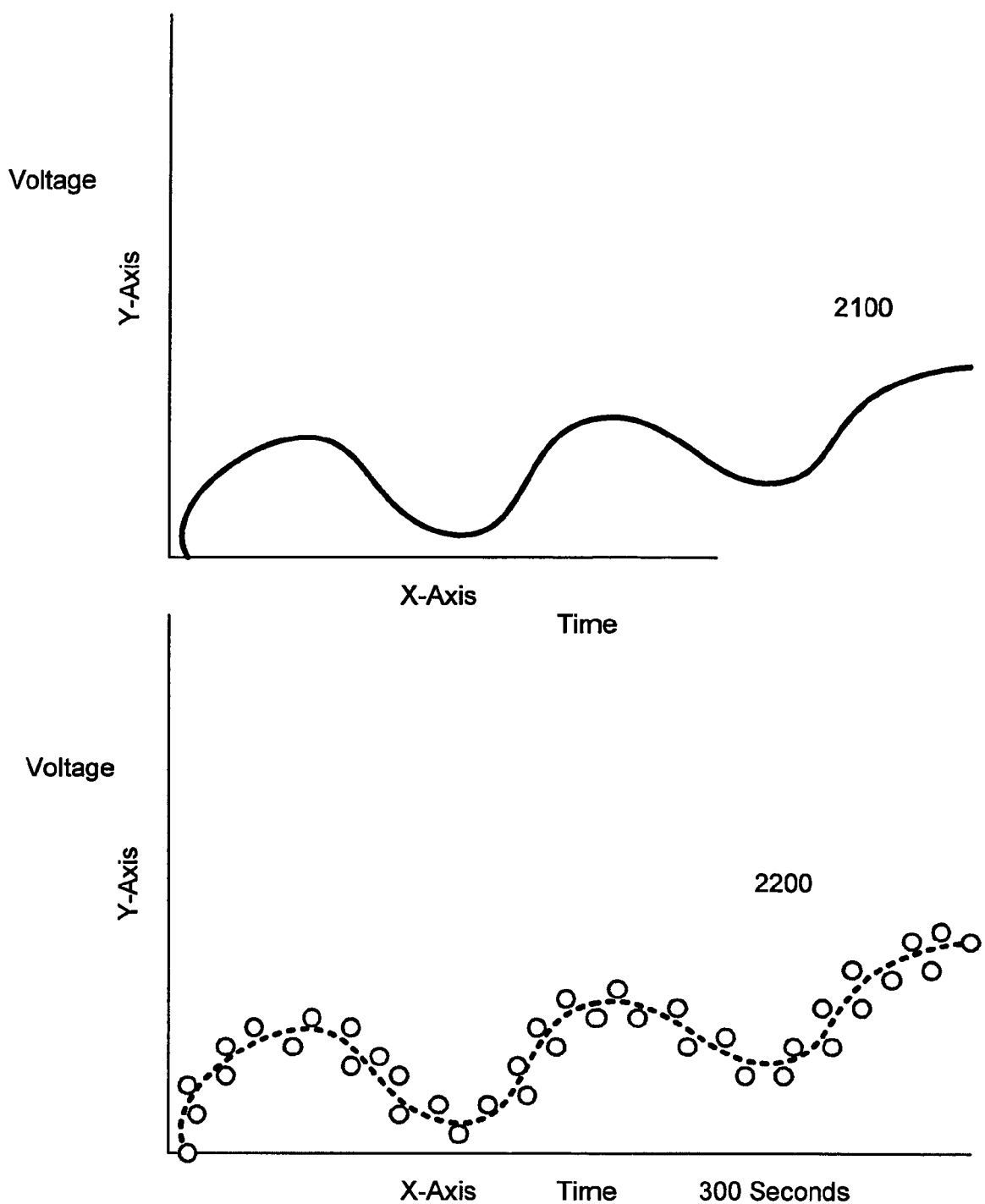
FIG. 2 is a graphic illustration of compressed analog data.

Shown in FIG. 2 is a comparison of data representative of sensed voltage over a period of time in accordance with a set of actually sensed data points 2100 and a subset of compressed data points 2200 representative of the actual data points 2100. In accordance with the present invention, the data points are processed in accordance with an analog data compression algorithm. It should be understood however that the waveforms shown therein are illustrative and are not to scale, but are rather intended to show the sufficiency of using error controlled data points comprising approximated data points and of eliminating data points which can be interpolated.

Operationally, a server 1700 executes an application program 1850 for processing field data. The processing program 1850 compresses data through interpolation and by modifying, eliminating and storing data which falls within an acceptable error. The acceptable error is designated as an absolute error value or as a deviation metric which is used to establish the boundaries within which received data must be located before it may be discarded or deleted. For example, in an application in which voltage varies as a function of time, the deviation metric may be designated as ±5 volts when voltage swings oscillate between 100 to 200 volts. The designation of the deviation metric may be designated in a plurality of ways. In one embodiment, the deviation metric may be designated as a percentage of the voltage oscillation between expected minimum and maximum voltage values. In the above example, the deviation metric was calculated as 5% of the lower boundary in a voltage swing within the expected range of 100 to 200 volts oscillation. Alternatively, a lower percentage may be designated when the range of oscillation is within 0 to 100 Volts. In yet still another alternative, the deviation metric may be based on historical data for the period time being monitored or may be the result of predicted values taking into account various operating factors such as time of day, month, season, year or a sensed device's operating mode.

Data acquired from the field and over a specified monitoring interval is allocated storage space in memory 1800 and initially and preferably stored without compression, although real-time or nearly real-time compression may be conducted. After each monitoring interval, the stored data points are analyzed for deletion and/or adjustment and replacement. If the monitoring interval is 5 minutes, and data is captured in one second intervals, 300 data points are initially stored for later compression processing.

Figure 3:
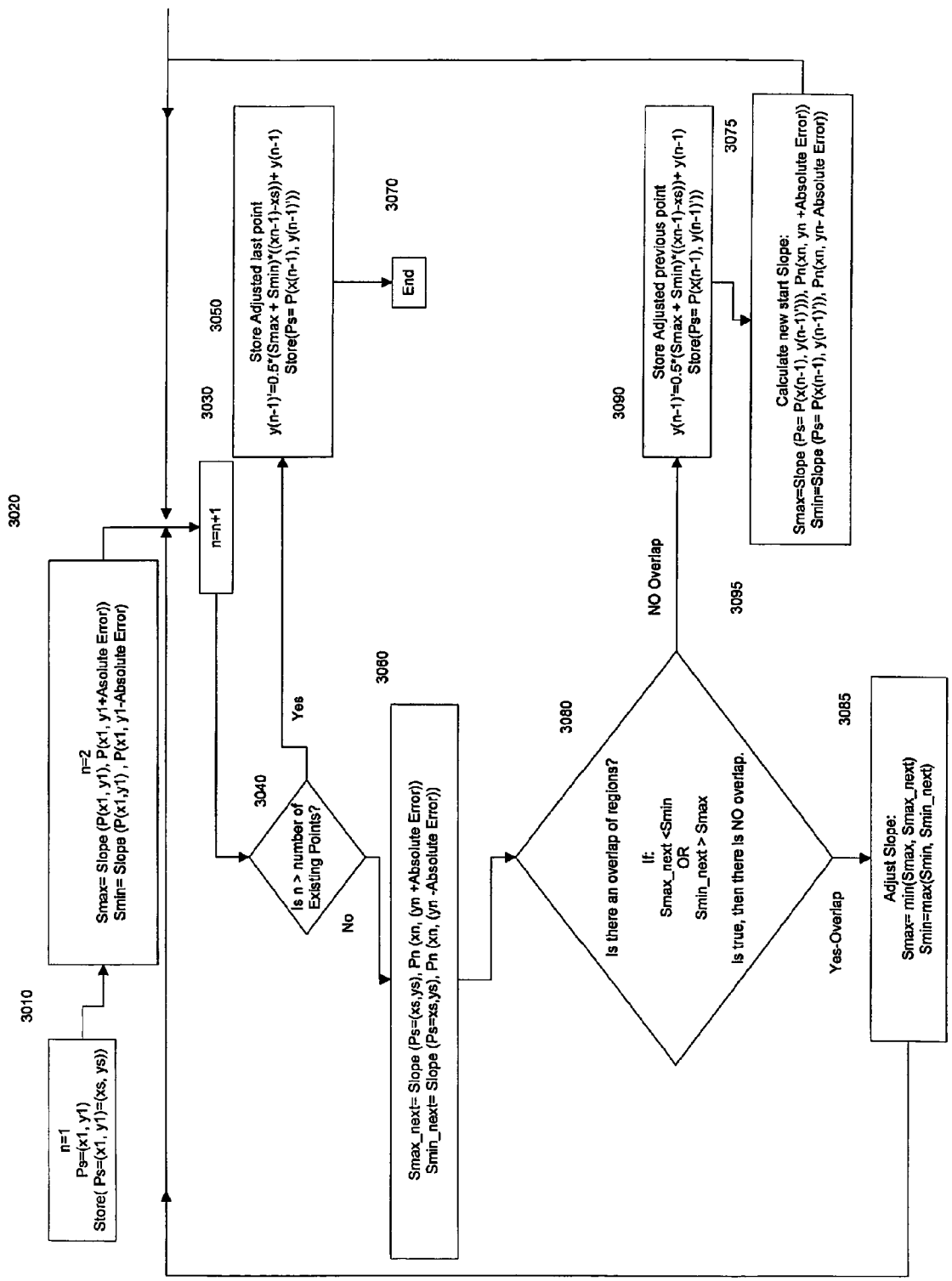
FIG. 3, is a flow chart of the compression algorithm.

Shown in FIG. 3 is flow diagram of the method of compressing the received analog field data. The processing steps are executable through one or more program/instruction modules callable during the execution of an application program, such as a compression engine. For example, a compression engine may comprise a deviation metric module, I/O module, reference data point module, reference slope module, data point module, previous data point adjustment module, a last data point module, an overlap decision module, artificial point module, data storage module or any other module having one or more callable instructions from one or more of the steps shown in FIG. 3. Moreover, its should be understood that process shown in FIG. 3, in whole or in part may be stored in any computer-readable medium or any other memory.

The 300 data points stored, are for purposes of this illustration, designated as the number of "Sampled Points" to be processed. The use of a 5 minute sampling window and a sampling rate of one sample/second are only illustrative and may be modified as necessary Data points are generally referenced as $P_n$ and correspond to $x_n$, $y_n$ coordinates. In step 3010 of the compression process for those Sampled Points, the first data point is referenced as $P_1$ and is the first stored data point ($P_s=(x_1, y_1)$). The variable n is used to designate the nth data point in the set of 300 Sampled Points.

In accordance with the present invention, the algorithm uses an accepted and introduced error range (±Absolute Error) to establish an acceptable error region for the data points being processed and analyzed. The next data point $P_2$ (n=2) is taken and as shown in step 3020, the initial reference slopes, $S_{max}$ and $S_{min}$ are determined by the slope of the lines formed from last stored data point $P_s$ ($P_1$) to artificial data points max and min of $P_2$–($x_2$, ($y_2$+5) and $P_2$–($x_2$, ($y_2$–5) (using artificial data points, $A_{2\,max}(x_2, (y_2+$Absolute Error) and $A_{2min}(x_2, (y_2-$Absolute Error)). The slope of a line between to points ($x_1$, $y_1$) and ($x_2$, $y_2$) shall be calculated by the difference between the y coordinate values and dividing the result by the difference between the x coordinate values—(slope=$(y_2-y_1)/(x_2-x_1)$).

In step 3030, the counter n=n+1 increments the n value by 1 and the next data point is taken. Before proceeding, a determination is made whether all the 300 data points have been processed. More specifically, a determination is made whether nth data point is greater than the number of Sampled Points.

If in step 3040, n is greater than the Sampled Points, (yes), step 3050 stores the adjusted last data point $P_{n-1}'$ having a value of ($x_{n-1}$, $y_{n-1}'$), where $y_{n-1}'$ is calculated as follows $$y_{n-1}'=0.5(S_{max}+S_{min})*(x_{n-1}-x_s)+y_s$$

and then the process stops at the End step 3070.

If however, n is not greater than the number of Sampled Data Points (all data points have not been processed), the process continues to step 3060 which calculates the next slopes between the last stored data point $P_s$ and the artificial data points of that next data point.

Step 3060 calculates the slopes between the last stored data point $P_s$ and the artificial data points $A_{n\ max}(x_n, (y_n+\text{Absolute Error}))$ and $A_{n\ min}(x_n, (y_n-\text{Absolute Error}))$ of the next data point $P_n$.

In step 3080, a determination is made whether the region formed by the last stored data point $P_s$ and lines passing through $P_s$ and having slopes $S_{max}$ and $S_{min}$ overlap with the region formed by $P_s$ and corresponding artificial data points $A_{n\ max}, A_{n\ min}$ of the next data point.

Regions will not overlap when $S_{max}\_\text{next}<S_{min}$ or $S_{min}\_\text{next}>S_{max}$ (when either condition is satisfied). If there is an overlap, an adjustment as shown in step 3085, is made to the reference slopes $S_{max}$ and $S_{min}$. The reference slopes are adjusted by resetting $S_{max}$ as the minimum value between $S_{max}$ and $S_{max}\_\text{next}(S_{max}=\min(S_{max}, S_{max}\_\text{next}))$ and by resetting $S_{min}$ as the maximum value between $S_{min}$ and $S_{min}\_\text{next}(S_{min}=\max(S_{min}, S_{min}\_\text{next}))$. The process continues by returning to step 3030 and incrementing the counter n=n+1 and taking the next data point to step 3040. It should be noted that if there is an overlap, the data point just analyzed is not stored in the compressed file, although in the next iteration of the process for the next data point, the previous data point which was not stored may be stored in a modified form if there is no overlap of regions as shown in step 3090.

If in step 3080, a determination is made that there is no overlap (when either condition, $S_{max}\_\text{next}<S_{min}$ or $S_{min}\_\text{next}>S_{max}$ is true), the process continues with step 3090 which stores an adjusted version of the previous data point (n−1) (x value stays constant and y value is modified). The y value of the previous data point is modified ($y_{n-1}'$ is an adjusted version of $y_{n-1}$) by using the following formula:

$$y_{n-1}'=0.5(S_{max}+S_{min})*(x_{n-1}-x_s)+y_s$$

The adjusted previous data point $P_{n-1}$ is then stored and becomes the new $P_s$.

In step 3095, new reference $S_{max}$ and $S_{min}$ slopes are calculated from the newly stored previous data point n−1 to the artificial data points of data point $P_n$. The process continues by returning to step 3030 and incrementing the counter n=n+1 and taking the next data point to step 3040.

In the following examples, the data points are represented as Cartesian coordinate (x, y), although other coordinate systems may be used. The data points are each analyzed to determine whether they fall within the deviation metric (±Absolute Error). More specifically, a set of artificial data points are created in which the coordinate values are calculated by keeping the abscissa value constant and adding and subtracting the deviation metric (±Absolute Error) from the ordinate value to obtain artificial data point values of $A2_{max}(x_2, (y_2+\text{Absolute Error}))$ and $A2_{min}(x_2, (y_2-\text{Absolute Error}))$ for data point $P_2(x_2, y_2)$ for example. Slopes are calculated for the lines formed between a stored point $P_s$ and the two artificial data points $A2_{max}$ and $A2_{min}$. In similar fashion, artificial data points are generated for data point $P_3$ to obtain artificial data points $A3_{max}$ and $A3_{min}$. Slopes are calculated for the lines formed between the last stored point $P_s$ and the two artificial data points $A3_{max}$ and $A3_{min}$. For each region formed by $A2_{max}-P_s-A2_{min}$ (region $R_2$), and $A3_{max}-P_s-A3_{min}$ (region $R_3$), a determination is then made whether the regions $R_2$ and $R_3$ bounded between $A2_{max}-P_s-A2_{min}$ and $A3_{max}-P_s-A3_{min}$ overlap.

Figure 4:
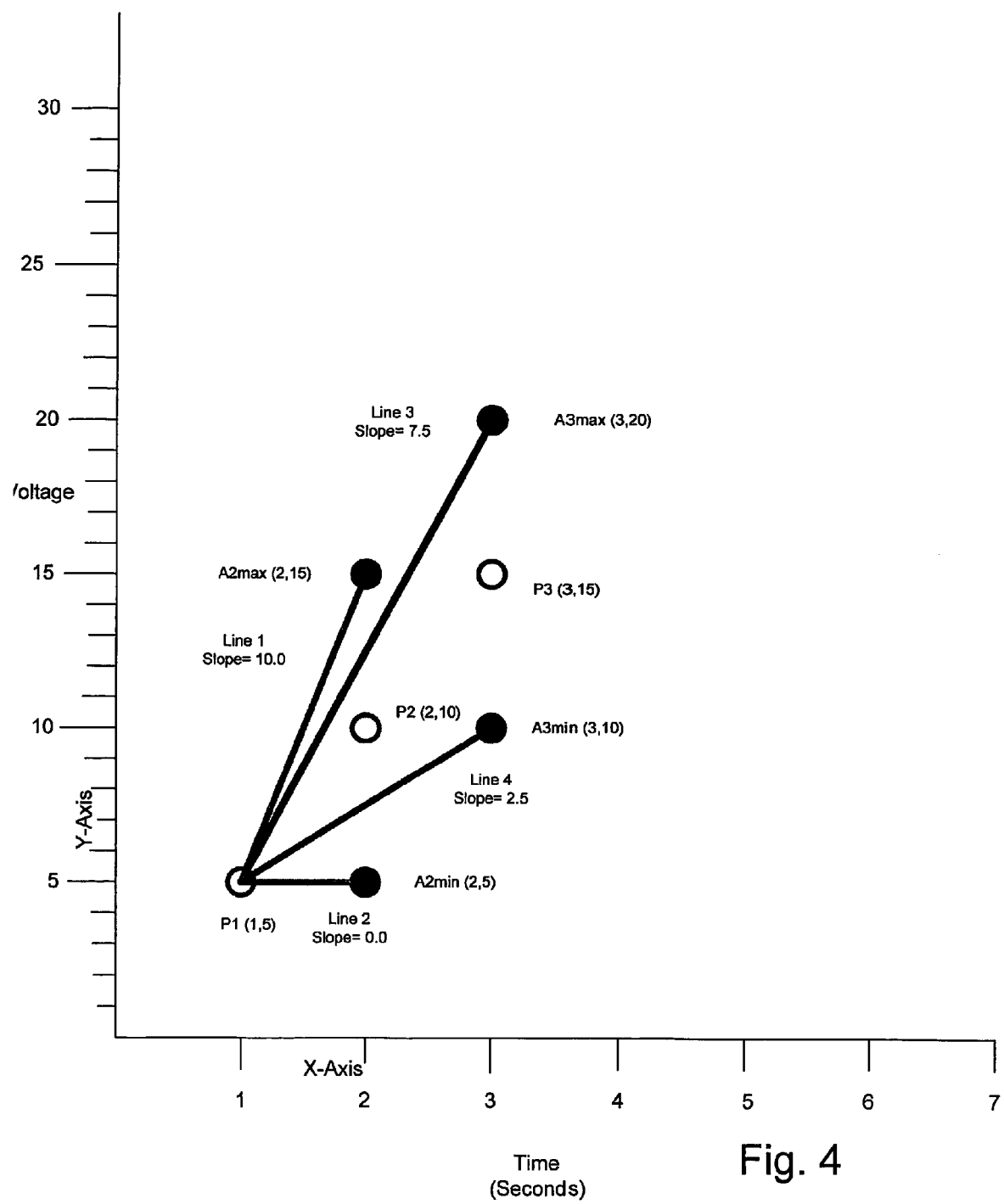
FIG. 4 is a plot of analog data points and overlapping regions.

Shown in FIG. 4, is a graphical representation of overlapping regions using the following data points:

$P_1(1, 5)$
$P_2(2, 10)$
$P_3(3, 15)$ having a deviation metric of ±5 assigned in order to calculate the artificial data points for $P_2$ and $P_3$.

| | |
|---|---|
| $P_1 =$ | vertex (last stored point $P_s$) |
| $P_2$ | Artificial Data Point for Point 2, $A2_{max} = (2, 15)$ |
| | Artificial Data Point for Point 2, $A2_{min} = (2, 5)$ |
| $P_3$ | Artificial Data Point for Point 3, $A3_{max} = (3, 20)$ |
| | Artificial Data Point for Point 3, $A3_{max} = (3, 10)$ |

Slopes for lines from $P_1$ to $A2_{max}, A2_{min}, A3_{max}$ and $A3_{min}$ are calculated as follows:

| | | |
|---|---|---|
| Slope of Line 1 | $P_1 - A2_{max}$ | $S2_{max} = (15 − 5)/(2 − 1) = 10.0 = S_{max}$ |
| Slope of Line 2 | $P_1 - A2_{min}$ | $S2_{min} = (5 − 5)/(2 − 1) = 0.0 = S_{min}$ |
| Slope of Line 3 | $P_1 - A3_{max}$ | $S3_{max} = (20 − 5)/(3 − 1) = 7.50 = S_{max}\_\text{next}$ |
| Slope of Line 4 | $P_1 - A3_{min}$ | $S3_{min} = (10 − 5)/(3 − 1) = 2.5 = S_{min}\_\text{next}$ |

Whether the regions overlap, can be determined by noting whether the slopes of the lines satisfy one of the two conditions: Condition $1=(S3_{max}<S2_{min})$ or Condition $2=(S3_{min}>S2_{max})$. If either condition exists, there is no overlap between the two regions and therefore it is not possible to construct a line interpolating points $P_1, P_2$ and $P_3$ such that an introduced error would be smaller than the designated deviation metric.

Graphically, these Lines 1, 2, 3, and 4 are shown in FIG. 4, with corresponding slopes of 10.0, 0.0, 7.5 and 2.5. As shown, the regions bounded by $P_1, A2_{max}, \& A_{min}2, (R_2)$ and $P1, A3_{max} \& A3_{min} (R_3)$ overlap in the region formed by $P_1$ and $A3_{max}$ and $A_{min}3$. The overlap region indicates an area in which data points would have a deviation metric or error margin within the designated ±5. In the instant example, data point $P_2$ may be deleted (discarded from the compressed file) since interpolation of a line from $P_1$ to $P_3$ would approximate the positional relationship of the points among $P_1, P_2$ and $P_3$ within the allowable deviation metric of ±5. The process is then continued by adjusting the reference slopes $S_{max}=\min(S_{max}, S3_{max})$ and $S_{min}=\max(S_{min}, S_{min}3)$. The process continues by comparing the regions bounded by $P_1$ (last stored point) and the artificial data points of next data point $P_4$ and the lines formed having slopes $S_{max}$ and $S_{min}$ and passing through $P_1$.

Figure 5:
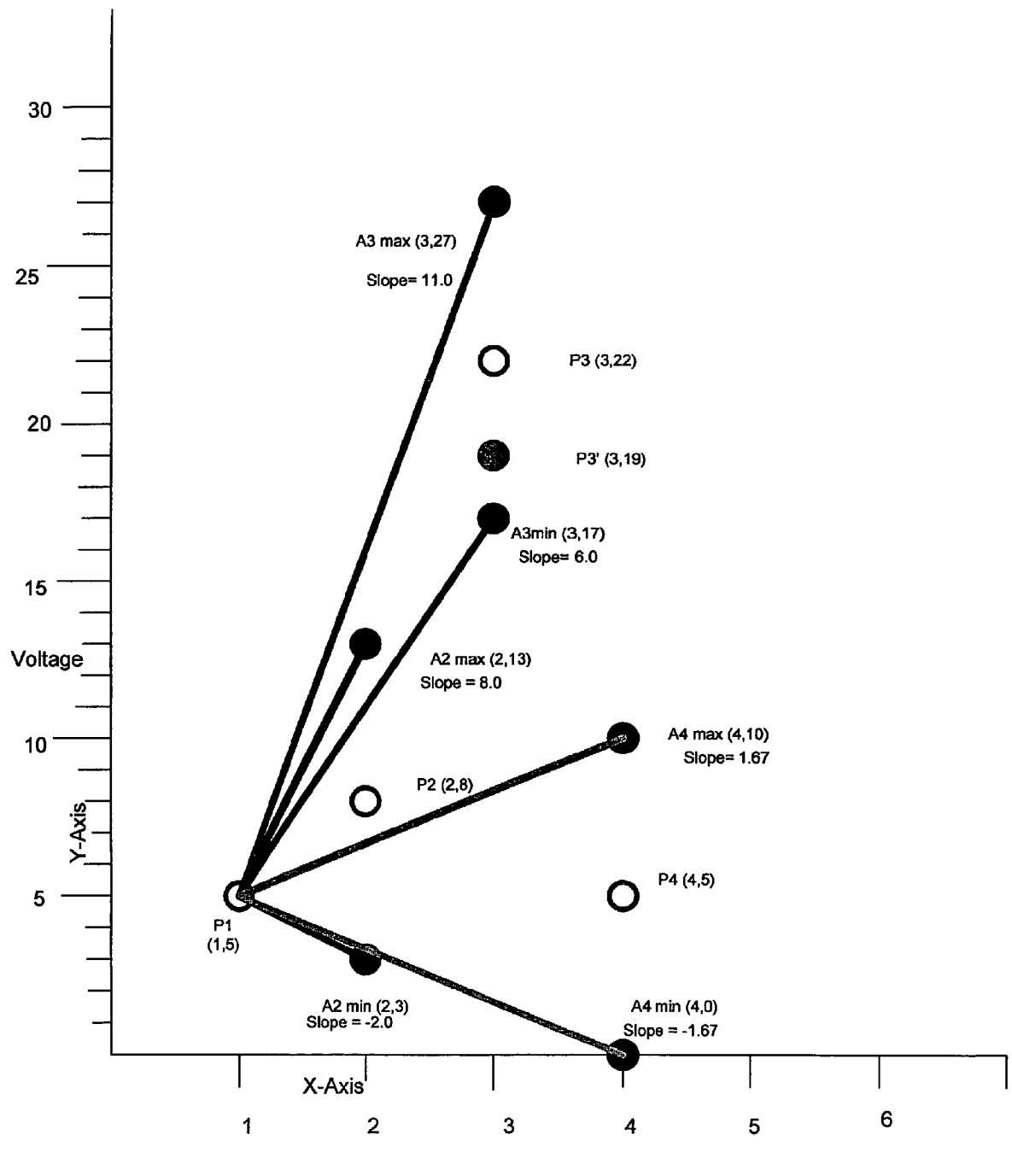
FIG. 5 is a plot of analog data of overlapping and non-overlapping regions.

In FIG. 5, a graphical representation of a sequence of data points is shown which demonstrate overlapping and non-overlapping regions in accordance with the present invention. For the following example the following set of data points are used, $P_1(1, 5)$
$P_2(2, 8)$
$P_3(3, 22)$
$P_4(4, 5)$ having a deviation metric of ±5 assigned in order to calculate the artificial data points. It should be Understood that the deviation metric may be static and/or dynamic over the time period of interest.

| | |
|---|---|
| $P_1 =$ | vertex |
| $P_2$ | Artificial Data Point for Point 2 $A2_{max}$ (2, 13) |
| | Artificial Data Point for Point 2 $A2_{min}$ (2, 3) |
| $P_3$ | Artificial Data Point for Point 3 $A3_{max}$ (3, 27) |
| | Artificial Data Point for Point 3 $A3_{min}$ (3, 17) |
| $P_4$ | Artificial Data Point for Point 4 $A4_{max}$ (4, 10) |
| | Artificial Data Point for Point 4 $A4_{min}$ (4, 5) |

Slopes for lines from P1 to $A2_{max}A_{min}2, A_{max}3$ and $A_{min}3$ are calculated as follows:

| | | |
|---|---|---|
| Slope of Line 1 | $P_1 - A_{max}2$ | $S2_{max} = (13 - 5)/(2 - 1) = 8.0 = S_{max}$ |
| Slope of Line 2 | $P_1 - A_{min}2$ | $S2_{min} = (3 - 5)/(2 - 1) = -2.0 = S_{min}$ |
| Slope of Line 3 | $P_1 - A3_{max}$ | $S3_{max} = (27 - 5)/(3 - 1) = 11.0 = S_{max}$—next |
| Slope of Line 4 | $P_1 - A3_{min}$ | $S3_{min} = (17 - 5)/(3 - 1) = 6.0 = S_{max}$—next |

With respect to data points $P_1$, $P_2$ and $P_3$, a comparison of the slopes for Lines 1, 2, 3 and 4 shows that neither condition 1 nor condition 2 exists.

where

Condition $1=(S3_{max}=(11)<S2_{min}=(-2.0))$ (not true)

or

Condition $2=(S3_{min}=(6.0)>S2_{max}=(8))$ (not true)

Since neither of the above two conditions is satisfied (is true), there must be an overlap. Graphically and as shown in FIG. 5, an overlap exists between Line 1 and Line 4 in the region bounded by $P_1$, $A2_{max}$ and $A3_{min}$. In accordance with the present invention, $P_2$ is excluded from being stored in the compressed file. Thereafter, the reference slopes are adjusted. The new reference slopes are determined as follows:

$S_{max}=\min(S_{max}, S_{max}\_\text{next})$ $S_{min}=\max(S_{min}, S_{min}\_\text{next})$ Or $S_{max}=\min(8.0, 11.0)=8.0$ $S_{min}=\max(-2.0, 6.0)=6.0$ Thereafter the process is repeated with next data point $P_4$ at step 3040.

Unlike the regions created by points $P_1$, $P_2$, and $P_3$, the regions created by $P_1$, $P_3$ and $P_4$ do not overlap—that is, the region formed by $P_1$ to $A3_{max}$ and $A3_{max}$, and $P_1$ to $A4_{max}$ and $A4_{min}$ do not overlap since Condition $1=(S4_{max}=(1.67)<S3_{min}=(6.0))$ is satisfied (true). Under these circumstances interpolation of between $P_1$, and $P_4$ cannot be made and therefore a modified version of $P_3(P_3')$ must be saved. In order to provide a better fit among $P_1$, $P_3$ and P4, the data point $P_3$ is adjusted and stored as $P_3'$. $P_3'$ retains the abscissa value, but acquires a new $y_3$ value,—namely $y_3'$. The new ordinate value for $P_3$ is calculated as follows:

| | | |
|---|---|---|
| | $y_{n-1}' = 0.5(S_{max} + S_{min}) * (X_{n-1} - X_s) + y_s$ | |
| Slope of Line 5 | $P_1 - A4_{max}$ | $S4_{max} = (10 - 5)/(4 - 1) = 1.67$ |
| Slope of Line 6 | $P_1 - A_{min}4$ | $S_{min}4 = (0 - 5)/(4 - 1) = -1.67$ |

The new ordinate value for new data point $y_3'$ is a function of slope maximums and minimums and is selected by taking the maximum slope between $S2_{min}(S_{min})$ and $S3_{min}$, and by taking the minimum slope between $S2_{max}(S_{max})$ and $S3_{max}$. In the above example, the maximum slope between $S2_{min}=-2.0$ and $S3_{min}=6$ is $S3_{min}=6$. On the other hand, the minimum slope between maximum slope S2 max=8 and S3 max=11 is $S2_{max}=8$. $S_{max}$ and $S_{min}$ are added and then multiplied by the difference between the abscissa values of $P_3$ and $P_1$ and further multiplied by 0.5. The resultant product is then added to the ordinate value of $P_1$. In the above example, $P_3'$ has x, y values of (3, 19) as calculated below:

$y_3'=0.5(S_{max}(-2.0, 6.0)+S_{min}(11.0, 8.0)*(3-1)+5$ $y_3'=0.5(6+8.0)*(2)+5$ $y_3'=0.5(14)*(2)+5$ $y_3'=0.5(28)+5$ $y_3'=14+5$ $y_3'=19$ $P_3$ is discarded and $P_3'(x_3, y')$ is stored and used as the vertex for further analysis of data points $P_4$ and $P_5$—the process repeats once again to determine whether there is an overlap of regions.

Figure 6:
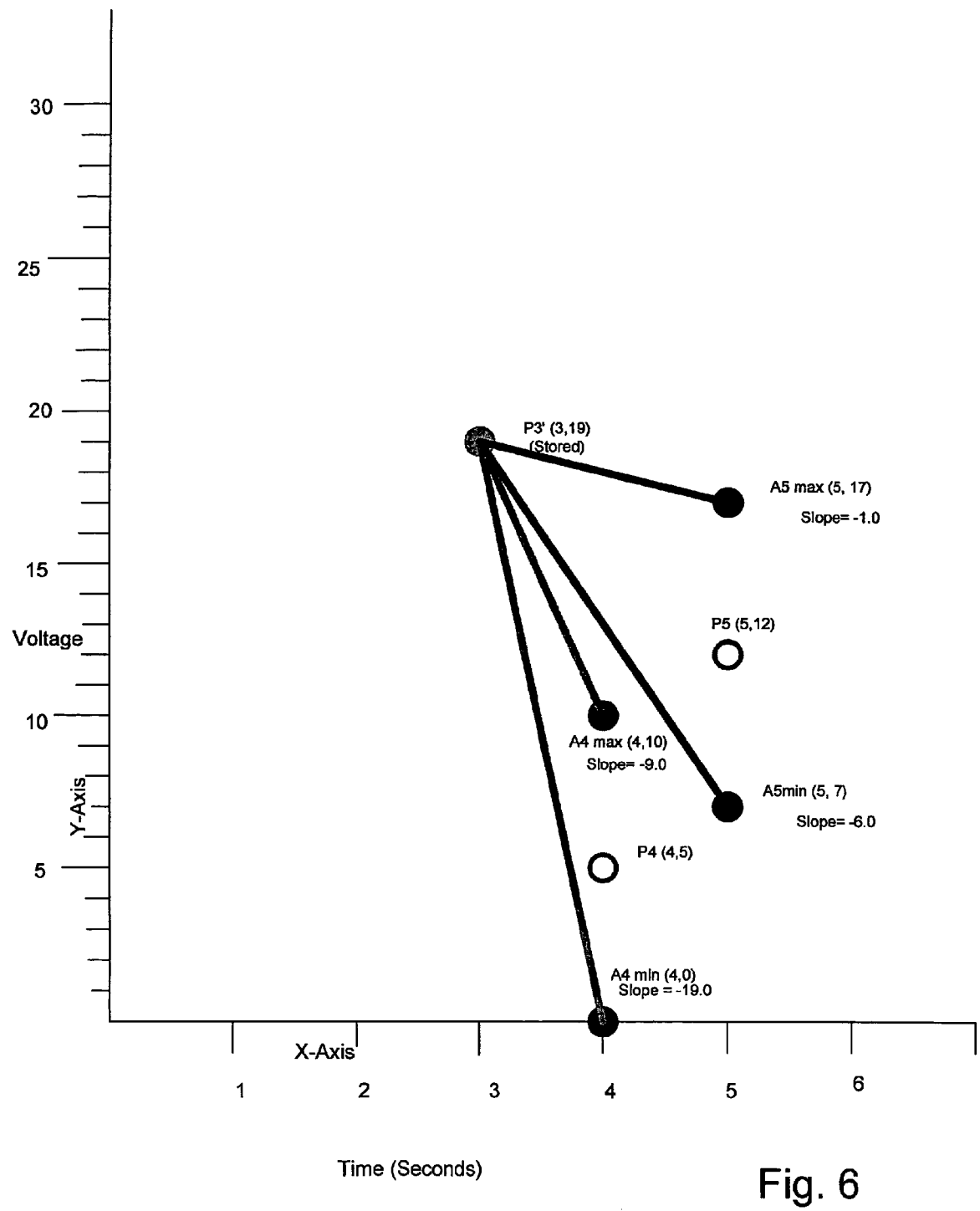
FIG. 6 is a plot of analog data having a new and adjusted stored data point.

Shown in FIG. 6, is a graphical representation of the iterated process utilizing the new $P_s(P_3')$ and data points $P_4(4, 5)$ and $P_5(5, 12)$. The regions formed and bounded by points A4 max–$P_3'$–A4 min and A5 max–$P_3'$–A5 min do not overlap since Condition 2 is true: Condition $2=(S5_{min}=(-6.0)>S4_{max}=(-9.0))$. Accordingly, $P_4$ will be adjusted and stored as $P_4'$.

While the inventive method and system have been particularly shown and described with reference to embodiments hereof, it should be understood by those skilled in the art that various changes in form and detail may be made therein without departing from the spirit and scope of the invention.

What is claimed is:

1. A method of compressing analog data from a first storage area to a second smaller storage area, comprising:
    defining a deviation metric within which input data may be interpolated;
    receiving the input data comprising at least three data points;
    determining a reference data point from which slopes are calculated, the reference data point being a stored data point;
    determining a reference maximum slope and a minimum reference slope;
    determining a set of two artificial data points for a second data point, the set of two artificial data points having a maximum artificial data point and a minimum artificial data point;
    calculating a maximum slope for the second data point from the reference data point to the maximum artificial data point;

calculating a minimum slope for the second data point from the reference data point to the minimum artificial data point;

determining whether condition 1 in which the maximum slope for the second data point is less than the reference minimum slope or condition 2 in which the minimum slope for the second data point is greater than the reference maximum slope is true;

if either condition 1 or condition 2 is true, adjusting the coordinates of a previous and first data point having a slope defined from the stored data point to a point between the reference maximum slope and the reference minimum slope, and storing the first data point as the new reference data point; and if neither condition 1 nor condition 2 is true, adjusting the reference maximum slope and the reference minimum slope by selecting as a new reference maximum slope, the minimum value between the reference maximum slope and the maximum slope of the second data point, and selecting as a new reference minimum slope, the maximum value between the reference minimum slope and the minimum slope of the second data point.

2. The method of claim 1, wherein the step of determining a set of artificial data points comprises subtracting the deviation metric from the ordinal value of the second data point to determine the minimal artificial data point and adding the deviation metric to the ordinal value of the second data point to determine the maximum artificial data point.

3. The method of claim 1, wherein the step of receiving the input data comprises the step of receiving input data for a selectable and predetermined period of time.

4. The method of claim 1 wherein the reference data point is the first data point in the input data.

5. The method of claim 1, further comprises the step of storing the input data in a first storage space and then storing processed input data into a smaller second storage space.

6. The method of claim 1, further comprising the step of calculating a new reference maximum slope and minimum slope after the step of adjusting the coordinates of the first data point, the new reference maximum slope being calculated from the new reference data point to the maximum artificial data point of the second data point and from the reference data point to the minimum artificial data point of the second data point.

7. The method of claim 1 wherein the input data is sequential.

8. The method of claim 1, further comprising the step of discarding the second data point if neither condition 1 nor condition 2 is true and proceeding to the next data point.

9. The method of claim 1, wherein the step of determining a reference maximum slope and a reference minimum slope comprises, calculating the slope between the reference data point and a maximum artificial data point and a minimum artificial data point of a first data point.

10. The method of claim 9 wherein the step of calculating the slope between the reference data point and the maximum artificial data point and the minimum artificial data point of the first data point comprises subtracting the deviation metric from the ordinal value of the first data point and adding the deviation metric to the ordinal value of the first data point.

11. A system for compressing analog data from a first storage area to a second smaller storage area, comprising:
a processor coupled to a communications network, the processor having an I/O interface;
means for storing data accessible by the processor;
a set of processor executable instructions for compressing input data, the set of processor executable instructions comprising
a deviation metric defining module for determining an accepted interpolating data range;
an I/O module for controlling the operation of the I/O interface and for receiving input data comprising at least three data points;
a reference data point module for determining a reference data point from which slopes are calculated, the reference data point being a stored data point;
a reference slope module for determining a reference maximum slope and a reference minimum slope;
an artificial data point module for determining a set of two artificial data points for a second data point, the set of two artificial data points having a maximum artificial data point and a minimum artificial data point;
a data slope module for calculating a maximum slope for the second data point from the reference data point to the maximum artificial data point and for calculating a minimum slope for the second data point from the reference data point to the minimum artificial data point;
an overlap decision module for determining whether condition 1 in which the maximum slope for the second data point is less than the reference minimum slope or condition 2 in which the minimum slope for the second data point is greater than the reference maximum slope is true, and if either condition 1 or condition 2 is true, adjusting the coordinates of a previous and first data point having a slope defined from the stored data point to a point between the reference maximum slope and the reference minimum slope, and storing the first data point as the new reference data point, and if neither condition 1 nor condition 2 is true, adjusting the reference maximum slope and the reference minimum slope by selecting as a new reference maximum slope, the minimum value between the reference maximum slope and the maximum slope of the second data point, and selecting as a new reference minimum slope, the maximum value between the reference minimum slope and the minimum slope of the second data point.

12. The system of claim 11, wherein the artificial data point module in determining the set of artificial data points, subtracts the deviation metric from the ordinal value of the second data point to determine the minimal artificial data point and adds the deviation metric to the ordinal value of the second data point to determine the maximum artificial data point.

13. The system claim 11, wherein the I/O module receives the input data for a selectable and predetermined period of time.

14. The system of claim 11 wherein the reference data point module selects the first data point in the input data, as the reference data point.

15. The system of claim 11, further comprising a data storage module for partitioning the means for storing data and storing raw input data in a first storage area and storing compressed input data in a second and smaller storage area.

16. The system of claim 11, wherein the reference slope module calculates a new reference maximum slope and minimum slope after the overlap decision module adjusts the coordinates of the first data point, and wherein the new reference maximum slope is calculated from the new reference data point to the maximum artificial data point of the second data point and from the reference data point to the minimum artificial data point of the second data point.

17. The system of claim 11, wherein the I/O module receives and processes sequential raw input data.

18. The system of claim 11, wherein the overlap decision module discards the second data point if neither condition 1 nor condition 2 is true and proceeds to the next data point.

19. The system of claim 11, wherein the reference slope modules calculates the slope between the reference data point and a maximum artificial data point and a minimum artificial data point of a first data point.

20. The system of claim 19 wherein the artificial data point module the slope between the reference data point and the maximum artificial data point and the minimum artificial data point of the first data point by subtracting the deviation metric from the ordinal value of the first data point and adding the deviation metric to the ordinal value of the first data point.

21. A computer-readable medium having stored thereon instructions for compressing analog data from a first storage area to a second smaller storage area, wherein said instructions when executed by a processor, cause the processor to perform the steps of:
    defining a deviation metric within which input data may be interpolated;
    receiving the input data comprising at least three data points;
    determining a reference data point from which slopes are calculated, the reference data point being a stored data point;
    determining a reference maximum slope and a minimum reference slope;
    determining a set of two artificial data points for a second data point, the set of two artificial data points having a maximum artificial data point and a minimum artificial data point;
    calculating a maximum slope for the second data point from the reference data point to the maximum artificial data point;
    calculating a minimum slope for the second data point from the reference data point to the minimum artificial data point;
    determining whether condition 1 in which the maximum slope for the second data point is less than the reference minimum slope or condition 2 in which the minimum slope for the second data point is greater than the reference maximum slope is true;
    if either condition 1 or condition 2 is true, adjusting the coordinates of a previous and first data point having a slope defined from the stored data point to a point between the reference maximum slope and the reference minimum slope, and storing the first data point as the new reference data point; and
    if neither condition 1 nor condition 2 is true, adjusting the reference maximum slope and the reference minimum slope by selecting as a new reference maximum slope, the minimum value between the reference maximum slope and the maximum slope of the second data point, and selecting as a new reference minimum slope, the maximum value between the reference minimum slope and the minimum slope of the second data point.

* * * * *